United States Patent
Glass et al.

(10) Patent No.: US 10,418,464 B2
(45) Date of Patent: Sep. 17, 2019

(54) TECHNIQUES FOR FORMING TRANSISTORS ON THE SAME DIE WITH VARIED CHANNEL MATERIALS

(71) Applicant: INTEL CORPORATION, Santa Clara, CA (US)

(72) Inventors: Glenn A. Glass, Portland, OR (US); Anand S. Murthy, Portland, OR (US); Hei Kam, Hillsboro, OR (US); Tahir Ghani, Portland, OR (US); Karthik Jambunathan, Hillsboro, OR (US); Chandra S. Mohapatra, Beaverton, OR (US)

(73) Assignee: INTEL Corporation, Santa Clara, CA (US)

( * ) Notice: Subject to any disclaimer, the term of this patent is extended or adjusted under 35 U.S.C. 154(b) by 0 days.

(21) Appl. No.: 15/573,168

(22) PCT Filed: Jun. 12, 2015

(86) PCT No.: PCT/US2015/035564
§ 371 (c)(1),
(2) Date: Nov. 10, 2017

(87) PCT Pub. No.: WO2016/200402
PCT Pub. Date: Dec. 15, 2016

(65) Prior Publication Data
US 2018/0108750 A1    Apr. 19, 2018

(51) Int. Cl.
*H01L 21/8238* (2006.01)
*H01L 29/66* (2006.01)
*H01L 29/78* (2006.01)
*H01L 27/092* (2006.01)
(Continued)

(52) U.S. Cl.
CPC .... *H01L 29/6681* (2013.01); *H01L 21/02532* (2013.01); *H01L 21/76224* (2013.01);
(Continued)

(58) Field of Classification Search
CPC ......... H01L 21/823821; H01L 29/7848; H01L 27/0924; H01L 21/8256; H01L 27/0605;
(Continued)

(56) References Cited

U.S. PATENT DOCUMENTS 9,997,414 B2 * 6/2018 Glass .............. H01L 21/823821
2007/0181977 A1 8/2007 Lochtefeld et al.
(Continued)

FOREIGN PATENT DOCUMENTS

WO    2016200402 A1    12/2016

OTHER PUBLICATIONS

International Search Report and Written Opinion received for PCT/US2015/035564. dated Mar. 11, 2016, 12 pages.
(Continued)

*Primary Examiner* — Savitri Mulpuri
(74) *Attorney, Agent, or Firm* — Finch & Maloney PLLC

(57) ABSTRACT

Techniques are disclosed for forming transistors on the same substrate with varied channel materials. The techniques include forming a replacement material region in the substrate, such region used to form a plurality of fins therefrom, the fins used to form transistor channel regions. In an example case, the substrate may comprise Si and the replacement materials may include Ge, SiGe, and/or at least one III-V material. The replacement material regions can have a width sufficient to ensure a substantially planar interface between the replacement material and the substrate material. Therefore, the fins formed from the replacement material regions can also have a substantially planar interface between the replacement material and the substrate material. One example benefit from being able to form replacement material channel regions with such substantially planar interfaces can include at least a 30 percent improvement in current flow at a fixed voltage.

19 Claims, 9 Drawing Sheets

(51) Int. Cl.
*H01L 21/02* (2006.01)
*H01L 21/762* (2006.01)
*H01L 21/8256* (2006.01)
*H01L 29/08* (2006.01)
*H01L 21/8258* (2006.01)
*H01L 27/06* (2006.01)

(52) U.S. Cl.
CPC ...... *H01L 21/8256* (2013.01); *H01L 21/8258* (2013.01); *H01L 21/823807* (2013.01); *H01L 21/823814* (2013.01); *H01L 21/823821* (2013.01); *H01L 27/0605* (2013.01); *H01L 27/0924* (2013.01); *H01L 29/0847* (2013.01); *H01L 29/7848* (2013.01); *H01L 21/823878* (2013.01); *H01L 29/66545* (2013.01)

(58) Field of Classification Search
CPC ....... H01L 21/823807; H01L 21/76224; H01L 21/02532; H01L 29/0847; H01L 29/6681; H01L 21/8258; H01L 21/823814; H01L 29/66545; H01L 21/823878
See application file for complete search history.

(56) References Cited

U.S. PATENT DOCUMENTS

| | | |
|---|---|---|
| 2011/0068407 A1 | 3/2011 | Yeh et al. |
| 2013/0153964 A1* | 6/2013 | Guo .................. H01L 21/8258 257/192 |
| 2013/0161693 A1 | 6/2013 | Adam et al. |
| 2014/0027860 A1 | 1/2014 | Glass et al. |
| 2014/0097518 A1 | 4/2014 | Cheng et al. |
| 2014/0145271 A1* | 5/2014 | Cheng .................. H01L 27/088 257/368 |
| 2014/0357060 A1 | 12/2014 | Liu et al. |
| 2014/0374802 A1* | 12/2014 | Harame .............. H01L 29/0817 257/197 |
| 2015/0028454 A1* | 1/2015 | Cheng .................. H01L 29/785 257/616 |
| 2015/0108616 A1 | 4/2015 | Greene et al. |
| 2015/0228730 A1* | 8/2015 | Yang .................... H01L 27/092 257/369 |
| 2017/0033186 A1* | 2/2017 | Han .................... H01L 21/0242 |
| 2017/0162447 A1* | 6/2017 | Glass ............. H01L 21/823821 |
| 2018/0151732 A1* | 5/2018 | Mehandru ............... H01L 29/78 |
| 2018/0158944 A1* | 6/2018 | Mohapatra ........ H01L 29/66795 |

OTHER PUBLICATIONS

International Preliminary Report on Patentability received for PCT/US2015/035564. dated Dec. 21, 2017. 9 pages.

Extended European Search Report received for EP Application No. 15895116.0, dated Dec. 7, 2018. 12 pages.

\* cited by examiner

TECHNIQUES FOR FORMING TRANSISTORS ON THE SAME DIE WITH VARIED CHANNEL MATERIALS

BACKGROUND

Increased performance and yield of circuit devices on a substrate, including transistors, diodes, resistors, capacitors, and other passive and active electronic devices formed on a semiconductor substrate, are typically major factors considered during design, manufacture, and operation of those devices. For example, during design and manufacture or forming of metal-oxide-semiconductor (MOS) transistor semiconductor devices, such as those used in complementary metal-oxide-semiconductor (CMOS) devices, it is often desired to increase movement of electrons (carriers) in n-type MOS device (n-MOS) channels and to increase movement of positive charged holes (carriers) in p-type MOS device (p-MOS) channels. Typical CMOS transistor devices utilize silicon as the channel material for both hole and electron majority carrier MOS channels.

DETAILED DESCRIPTION

Figure 1:
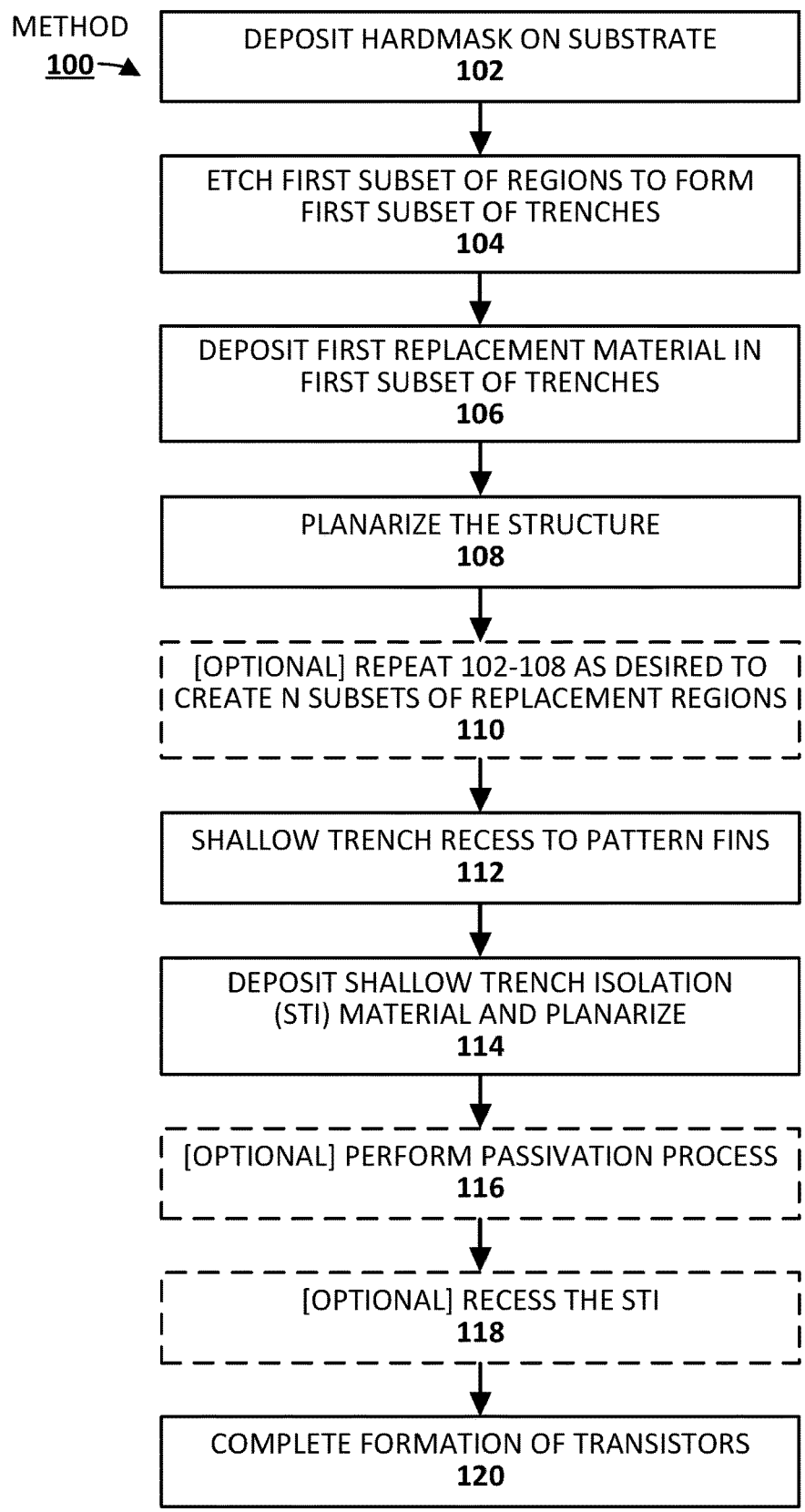
FIG. 1 illustrates a method of forming an integrated circuit, in accordance with various embodiments of the present disclosure.

Techniques are disclosed for forming transistors on the same die with varied channel materials. The techniques include forming relatively large replacement material regions in the die/substrate, and then forming fins in those regions. The fins can then be used to form transistor channel regions, as well as source and drain regions. In an example case, the substrate may comprise Si and the replacement materials may include, for instance, Ge, SiGe, and/or at least one III-V material. The replacement material regions can have a width sufficient to ensure a substantially planar interface between at least a majority of the replacement material and the substrate material (e.g., at least 2 times wider than the average width of fins therefrom). Therefore, the fins formed from the replacement material regions can also have a substantially planar interface between the replacement material and the substrate material. One example benefit from being able to form replacement material channel regions with such substantially planar interfaces can include at least a 30 percent improvement in current flow at a fixed voltage. Numerous variations and configurations will be apparent in light of this disclosure.

General Overview

Silicon (Si) is commonly used as a substrate material for forming circuit devices, such as transistors. In some such cases, Si may be used exclusively for the channel element material, such as in metal-oxide-semiconductor (MOS) transistors and tunnel field-effect transistor (FET) devices, for both n-type and p-type devices. While silicon (Si) is a relatively common, inexpensive, and abundant wafer material, it may not provide the best performance as channel material for transistor devices. Therefore, it may be desirable in some applications to form multiple transistors on the same substrate where the transistors have varied channel materials.

Thus, and in accordance with one or more embodiments of the present disclosure, techniques are disclosed for forming transistors on the same die with varied channel materials. The techniques can allow for custom combinations of materials to be mixed and matched on a single bulk die or substrate to optimize performance for each device's active carrier polarity. In some embodiments, for instance, transistors may be formed on a given substrate having diverse channel regions, where the diverse channel regions comprise at least two of the following: Si, germanium (Ge), silicon germanium (SiGe), and a III-V material (e.g., indium gallium arsenide (InGaAs), indium phosphate (InP), indium arsenide (InAs), etc.). For example, the techniques could be used to form a combination of n-MOS Si channel and p-MOS SiGe channel devices on a Si substrate, where the n-MOS channels are formed from the Si substrate material native to the substrate and the p-MOS channels are formed from the SiGe replacement material added to the substrate. In such an example case, one or more regions of the Si substrate can be replaced by a relatively broad swath of SiGe material suitable for the p-MOS devices. Continuing from that example case, if III-V material based n-MOS devices are desired, then n-MOS devices may be formed with channel regions comprising at least one III-V material, where one or more relatively large regions of the Si substrate are replaced by a region comprising at least one III-V material. Note that native Si regions used for the channel of one or more transistors may or may not remain, depending on the end use or target application. In some embodiments, one or more CMOS devices may be formed from the n-MOS and p-MOS devices having varied channel materials.

The techniques described herein cause a substantially planar interface between the underlying substrate and the replacement material(s) to be formed as a result of the relatively wide regions of the replacement material(s) formed in the substrate prior to forming fins out of that replacement material(s). Substantially or nearly or about planar as used herein may include exactly planar plus or minus 5, 10, 15, or 20 percent variation from exactly planar, for example. Thus, each of the lowest and highest points of a given interface would be within the given tolerance of perfect or exact planarity. In a more general sense, the interface between the underlying substrate and the replacement material(s) is flatter than the interface would be if that interface was formed via a single fin replacement process where a place holder fin is etched out and replaced with other material. The wide replacement regions may be at least 1.5, 2, 3, 4, 5, 10, 20, 50, or 100 times, or some other suitable minimum value that provides the desired degree of planarity between the underlying substrate and the replacement material. In a more general sense, the width of the replacement material is more than a single fin width and may include a size equivalent to double rows of fins, quadruple rows of fins, or more.

Forming fins from such wider regions allows for the interface between the replacement regions and the underlying substrate to be substantially planar in at least a majority of the replacement region, resulting in fins including a substantially planar interface between the replacement material and the substrate. This can be compared to, for example, replacing material in a trench formed in a substrate, the trench being formed via chemical etching to be the width of the desired fin, which results in a faceted interface between the replacement material and the substrate material. Such a faceted trench bottom has been found to inhibit nucleation. It will be further appreciated in light of this disclosure that trenches formed by physical etching (e.g., ion bombardment) are also not suitable, because such trench forming techniques lead to significant amorphization and crystalline damage at the trench bottom, which has been found to inhibit epitaxial growth. Thus, faceted trench bottoms and trench bottoms having crystalline damage and/or amorphization tend to provide an inadequate interface surface for replacement materials. Such trench bottoms tend to be inherent in typical trench-forming processes, particularly where the trenches are the size of a single fin structure. To this end, the techniques of the present disclosure avoid non-flat or otherwise ill-formed trench bottoms. Further, it is difficult to clean the bottom surface of trenches that are one fin in width, resulting in a starting surface for deposition of the replacement material that is lower quality than the starting surface provided in the trenches formed using the techniques of the present disclosure. For example, it is easier to clean the relatively wider trenches (e.g., trenches that are at least two times the width of fins to be formed therein) formed using the techniques of the present disclosure, thereby allowing for a higher quality starting surface for deposition of the replacement material (e.g., at least in the portions where the fins are to be later formed).

As a result of replacement regions and fins being formed before shallow trench isolation (STI), a passivation process may be used to help prevent issues caused by subsequent processing, such as to prevent issues caused by the deposition of the STI material (or to increase the compatibility of the STI material with the varying fin materials). The techniques can be used to form planar or non-planar (e.g., finned or nanowire/nanoribbon) transistor configurations, as will be apparent in light of the present disclosure.

Upon analysis (e.g., using scanning/transmission electron microscopy (SEM/TEM) and/or composition mapping), a structure or device configured in accordance with one or more embodiments will effectively show a substrate with multiple transistors, such transistors including varied channel materials. In some cases, the die or substrate may comprise transistors having channel regions comprising at least two of the following materials: Si, Ge, SiGe, and a III-V material. For example, the substrate may be a bulk silicon substrate, and replacement channels of transistors formed on the substrate may comprise SiGe and at least one III-V material (e.g., InGaAs, InP, InAs, etc.), where there may or may not also be transistors formed having native Si channels formed from the Si substrate material. Therefore, the channel regions may be formed from and/or on the substrate material. In some cases, the techniques may be detected by observing the interface between the replacement material and the underlying substrate material in the replacement channel regions of transistors. The techniques variously described herein can provide various benefits including being able to form multiple transistors on a single die or substrate, where the transistors comprise varied channel materials such that a first transistor may include a channel region comprising a first semiconductor material and a second transistor may include a channel region comprising a second semiconductor material. Another benefit, in some embodiments, may be improvement of transistor performance, such as improved current flow (e.g., greater than 10, 20, 30, 40, or 50 percent current flow improvement at a fixed voltage). Such benefits can be achieved as a result of the substantially planar interface between the channel replacement material and the underlying substrate material on which the replacement material was formed. The substantially planar interface is achievable due to the relatively wider regions of replacement material from which fins are formed, where the deposition of the replacement material in the relatively wider regions can be performed on a flatter and cleaner starting surface. Numerous configurations and variations will be apparent in light of this disclosure.

Architecture and Methodology

FIG. 1 illustrates a method 100 of forming an integrated circuit, in accordance with one or more embodiments of the present disclosure. FIGS. 2A-K illustrate example structures that are formed when carrying out method 100 of FIG. 1, in accordance with various embodiments. Although the structures of FIGS. 2A-K are primarily depicted and described herein in the context of forming finned transistor configurations (e.g., tri-gate or finFET), the present disclosure need not be so limited. For example the techniques can be used to form planar, dual-gate, finned, and/or nanowire (or gate-all-around or nanoribbon) transistor configurations, or other suitable configurations, as will be apparent in light of this disclosure. FIG. 3 illustrates an integrated circuit including various transistor configurations formed using the techniques described herein, in accordance with an embodiment.

Figure 2A:
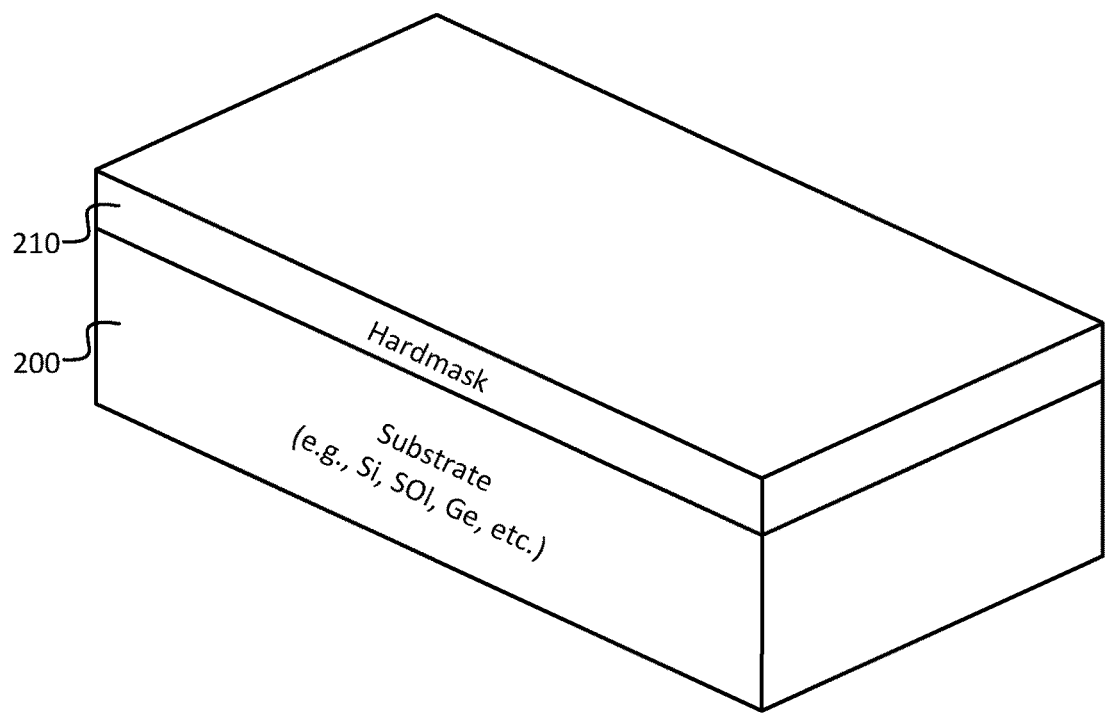
FIGS. 2A-K illustrate example structures that are formed when carrying out the method of FIG. 1, in accordance with various embodiments of the present disclosure.
Figure 3:
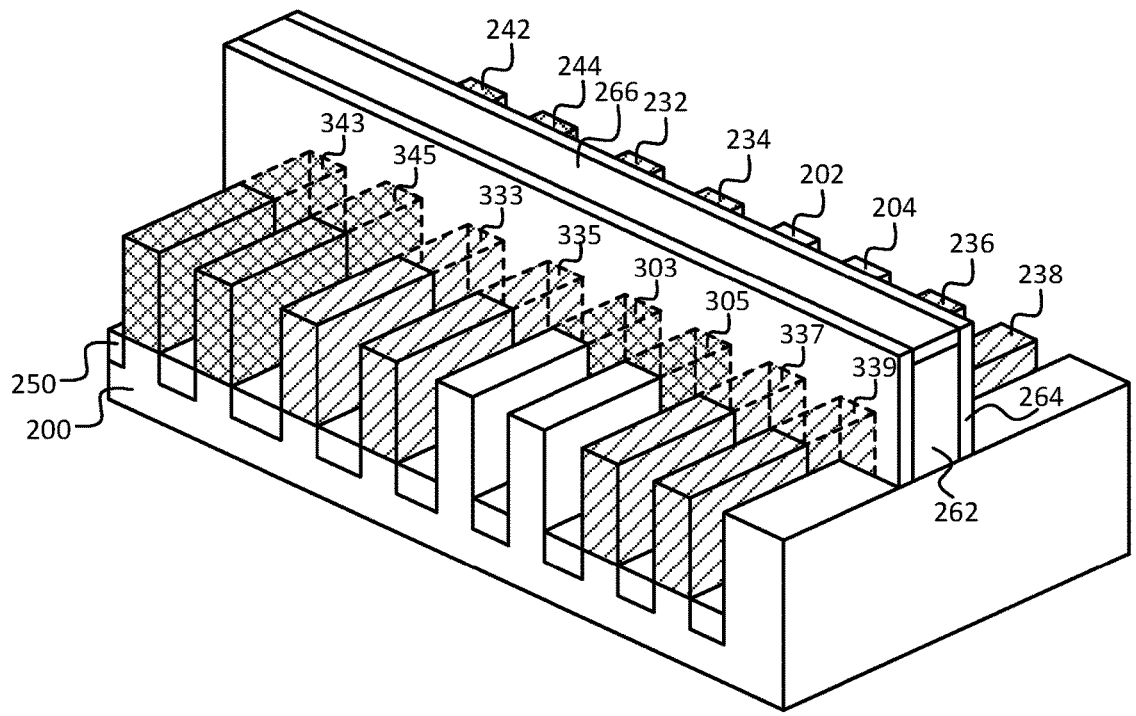
FIG. 3 illustrates an integrated circuit formed using the method of FIG. 1, in accordance with an embodiment of the present disclosure.

As can be seen in FIG. 1, method 100 includes depositing 102 hardmask 210 on a substrate 200 to form the example resulting structure shown in FIG. 2A, in accordance with an embodiment. In some embodiments, substrate 200 may be: a bulk substrate comprising, e.g., Si, SiGe, and/or a III-V material; an X on insulator (XOI) structure where X comprises Si, SiGe, Ge, and/or a III-V material and the insulator material is an oxide material or dielectric material or some other electrically insulating material; or some other suitable multilayer structure where the top layer comprises Si, SiGe, and/or a III-V material. Hardmask 210 on substrate 200 can be deposited using any suitable technique. For example, hardmask 210 may be blanket deposited or grown on substrate 200 using chemical vapor deposition (CVD), atomic layer deposition (ALD), liquid phase epitaxy (LPE), physical vapor deposition (PVD), molecular beam epitaxy (MBE), and/or any other suitable process to form hardmask 210 on substrate 200. In some instances, the surface of substrate 200 to be deposited on may be treated (e.g., chemical treatment, thermal treatment, etc.) prior to deposition of hardmask 210. Hardmask 210 may be comprised of any suitable material, such as various oxide or nitride materials, for example. Specific oxide and nitride materials may include silicon oxide, titanium oxide, hafnium oxide, aluminum oxide, or titanium nitride, just to name a few. In some cases, the hardmask 210 material may be selected based on the substrate 200 material used.

Figure 2B:
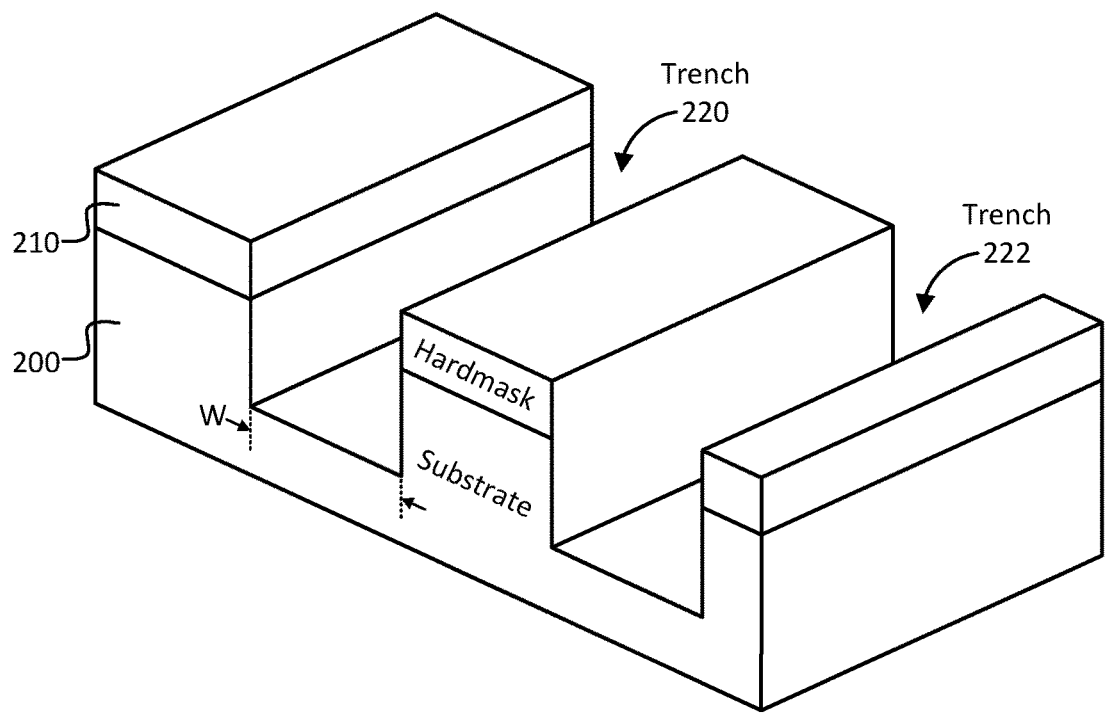

Method 100 of FIG. 1 continues with etching 104 a first subset of regions to form a first subset of trenches 220, 222, thereby forming the resulting example structure shown in FIG. 2B, in accordance with an embodiment. Etching 104 to form the first subset of trenches 220, 222 may include any suitable etching techniques, such as a technique including the following processes, for example: spin resist, expose, develop, etch and ash to produce trenches 220. Note that any suitable techniques may be used to form trenches 220, 222, such as various lithography techniques and various wet and/or dry etch processes. In some embodiments, etch 104 may be performed in-situ/without air break, while in other embodiments, etch 104 may be performed ex-situ. Trenches 220, 222 may be formed with varying widths W based on the end use or target application. For example, trenches 220, 222 may be formed with a width W of more than a single fin width, more than a double row of fins, more than a quadruple row of fins, and so on. Accordingly, trenches 220, 222 (and thus the resulting replacement regions) may be formed to be at least 1.5, 2, 3, 4, 5, 10, 20, 50, or 100 times, or some other suitable minimum value, wider than the average width of fins to be formed therefrom. More specifically, trenches 220, 222 may be formed to be greater than 10, 20, 40, 60, 100, 200, or 500 nm, or some other suitable minimum width, for example, depending upon the end use or target application. In some embodiments, the trench width W may be determined by the process node of operation (e.g., 3 nm node, 5 nm node, 7 nm node, 10 nm node, etc.) and/or the desired fin width/pitch/quantity for the resulting structure. In some embodiments, trench 222 may be formed to have the same or a different width than the width of trench 220. Note that although two trenches 220, 222 are shown in the structure of FIG. 2B, any number of trenches may be formed, including only one trench or a plurality of trenches, depending upon the end use or target application.

Figure 2C:
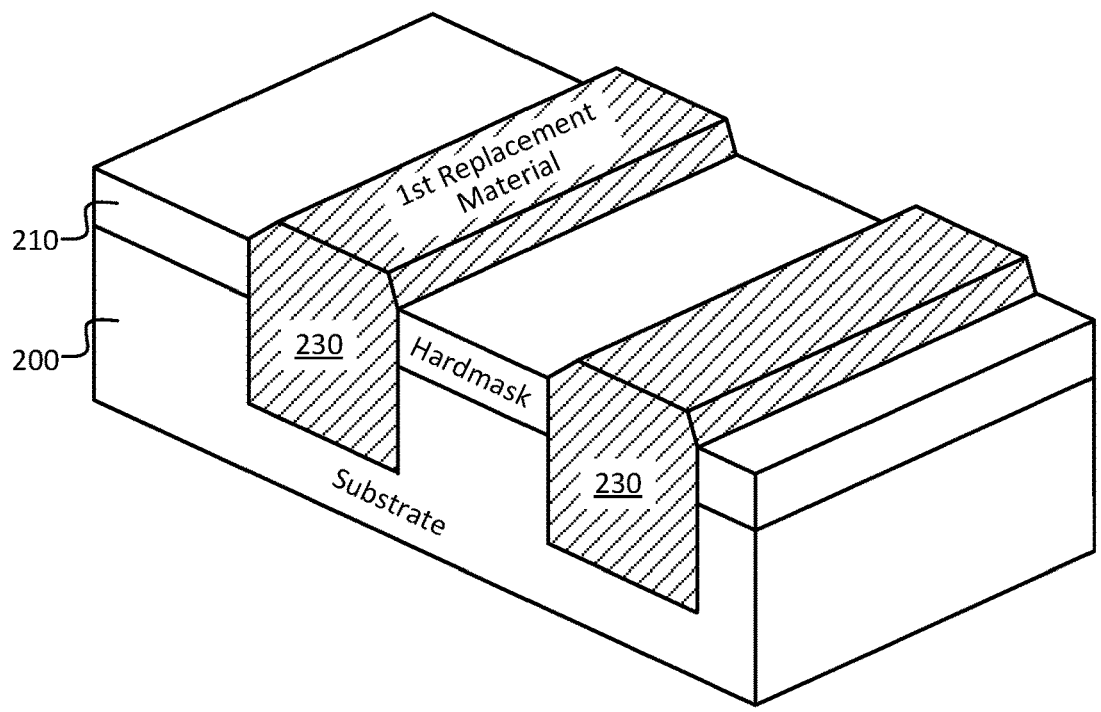

Method 100 of FIG. 1 continues with depositing 106 a first replacement material 230 in the first subset of trenches 220, 222 to form the resulting example structure shown in FIG. 2C, in accordance with an embodiment. Method 100 of FIG. 1 continues with planarizing 108 the structure of FIG. 2C to form the structure of FIG. 2D, in accordance with an example embodiment. In some embodiments, deposition 106 of first replacement material 230 may include any deposition process described herein (e.g., CVD, ALD, LPE, PVD, MBE), or any other suitable deposition process. As can be seen in FIG. 2C, deposition 106 is a selective deposition process in this example embodiment, such that replacement material 230 is only retained in trenches 220, 222 (and is not retained on the hardmask 210 material). However, the deposition 106 process need not be selective and a non-selective process could be used in some instances. The selectivity of the deposition 106 may be determined based on the sticking coefficient between the material being deposited/grown and the surface(s) on which the deposition/growth is made. Deposition 106 may include a constant deposition of replacement material 230, or it may include a graded or multilayer deposition. In other words, the replacement material 230 may be, for example, single composition, graded, or multilayered. In addition, replacement material 230 may be strained and/or doped depending on the end use or target application. In this example embodiment, planarizing 108 the surface of FIG. 2C includes removing excess fill, removing roughness, and removing hardmask material 210 to form the structure shown in FIG. 2D.

In some embodiments, first replacement material 230 may comprise, for example, Si, SiGe, and/or one or more III-V materials. In an example embodiment, the substrate 200 may comprise Si and the replacement material 230 may comprise SiGe. In such an example embodiment, SiGe may comprise $Si_{1-x}Ge_x$ where x may range from 0.01 to 1 (e.g., 0.2<x<0.8, to provide an example range). Therefore, in some embodiments, the replacement material may comprise 100 percent Ge by itself or as a layer in the SiGe material (e.g., if the SiGe was deposited in a graded manner). In another example embodiment, the substrate 200 may comprise Si and the replacement material 230 may comprise one or more III-V materials. Example III-V materials include gallium arsenide (GaAs), indium phosphide (InP), indium arsenide (InAs), indium gallium arsenide (InGaAs), aluminum arsenide (AlAs), or indium aluminum arsenide (InAlAs), or any other suitable III-V material. In some embodiments, if replacement material 230 comprises one or more III-V replacement materials, the material may comprise a single layer or comprise a multilayer stack of III-V materials, such as InP/InGaAs/InAs, GaAs/InP/InAs, GaAs/InGaAs/InAs, GaAs/InAlAs/InAs, InP/InGaAs/InP, GaAs/InAs, GaAs/InGaAs, or InP/InGaAs, or any other suitable multilayer stack comprising two or more III-V materials. In some such embodiments where replacement material 230 is a III-V multilayer stack, a high bandgap III-V material may be used near the bottom of the stack (e.g., to help reduce leakage current to ground), such as GaAs, InP, InAlAs, or AlAs, for example. Further, in some such embodiments, a III-V multilayer stack may employ a low bandgap III-V material near the top of the stack (e.g., to help with making contact to the stack), such as InAs or InGaAs, for example. The materials discussed herein may be strained and/or doped depending on the end use or target application.

Figure 2D:
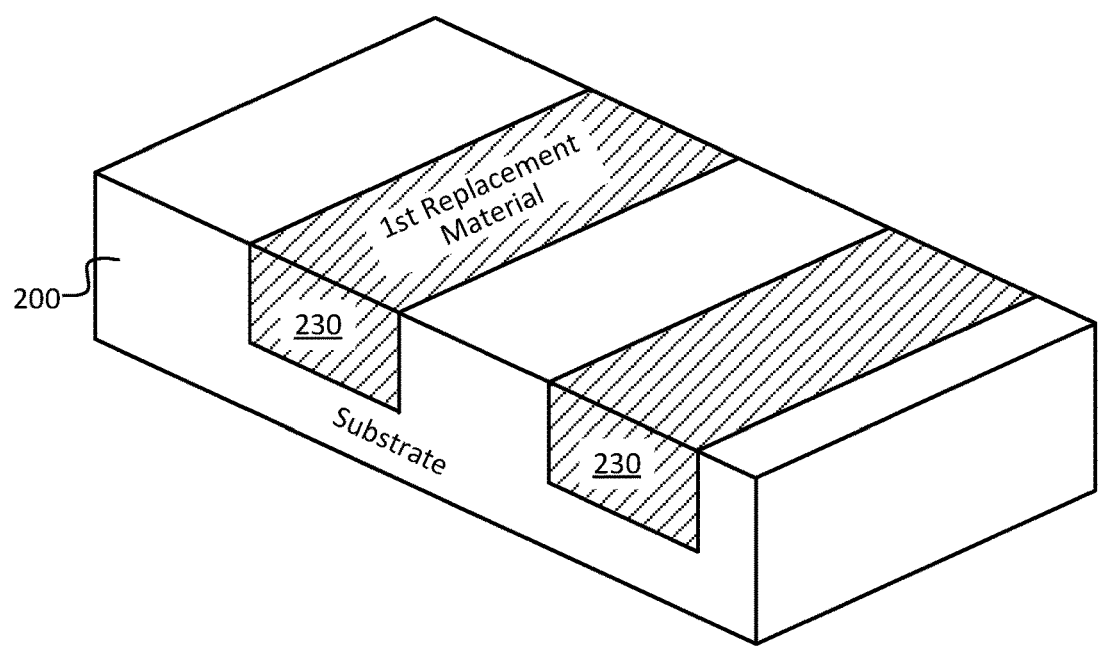

In the example structure shown in FIG. 2D, substrate 200 may comprise Si and first replacement material 230 may comprise SiGe, such that there are alternating native Si regions and replacement SiGe regions. In such an example, the native Si regions may be used to form n-MOS devices and the SiGe replacement regions may be used to form p-MOS devices, and the combination may then be used to form CMOS devices, as will be apparent in light of the present disclosure. In the example structure shown in FIG. 2D, substrate 200 may comprise SiGe and the first replacement material 230 may comprise one or more III-V materials, such that there are alternating native SiGe regions and replacement III-V material regions. In such an example, the native SiGe regions may be used to form p-MOS devices and the III-V replacement regions may be used to form n-MOS devices, and the combination may then be used to form CMOS devices, as will be apparent in light of the present disclosure. Such material combinations are provided for illustrative purposes only and are not intended to limit the present disclosure in any manner. Numerous other material combinations will be apparent in light of this disclosure.

Figure 2E:
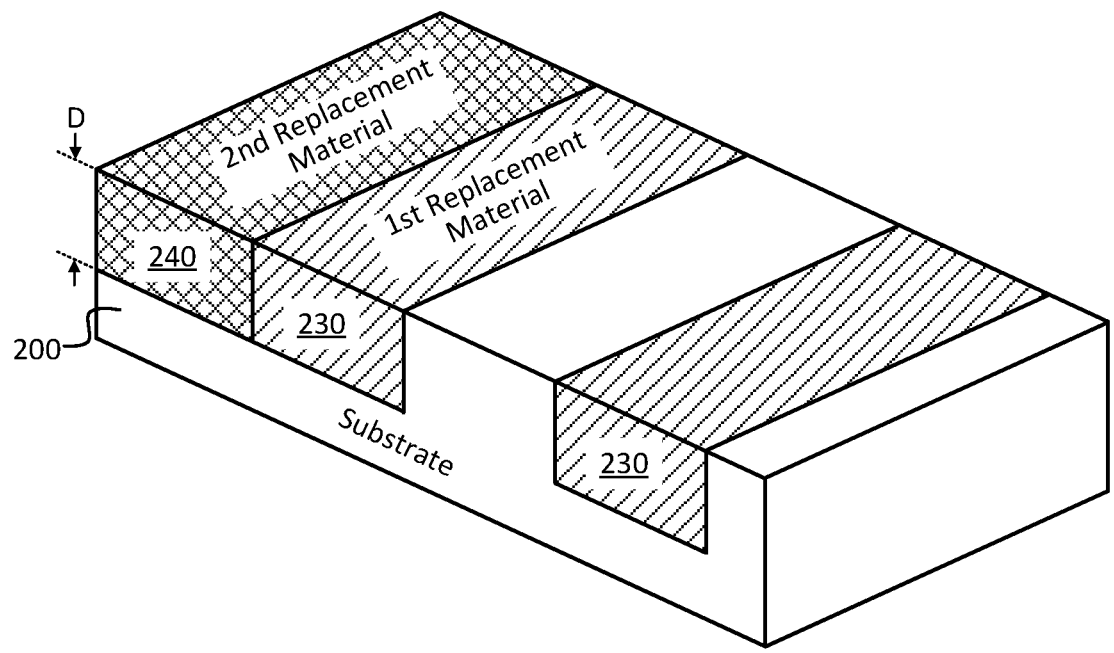

Method 100 of FIG. 1 optionally continues with repeating 110 processes 102-108 described herein as desired to create N number of subsets of replacement regions. In accordance with an example embodiment, FIG. 2E illustrates repeating 110 processes 102-108 (e.g., mask, etch, deposit, planarize) one time to form the second replacement material region 240. Although the depths D of regions 230 and 240 are shown as being the same in this example case for ease of illustration, they need not have the same depths. For example, in other cases the etch process 104 may be performed to create deeper or shallower trenches for subsequent replacement material regions. More specifically, in this example case, the trenches for replacement region 240 may have been formed to be 1.1, 1.2, 1.5, 2, 2.5, 3, 4, 5, or 10 times, or some other suitable relative amount, deeper or shallower relative to trenches 220, 222 formed for replacement regions 230, which would have resulted in the depth D of region 240 being relatively deeper or shallower after the deposition 106 and planarize 108 processes were performed. Different depths D per replacement material regions may be selected to accommodate subfin current leakage control methods, such as subfin conversion to insulator or subfin doping, for example. Other benefits to selecting different depths D for the replacement material regions will be apparent in light of this disclosure. Note that if processes 102-108 are repeated 110 multiple times to form N subsets of replacement regions, the replacement trenches may include additional depth than the final desired depth per subset of replacement regions to allow for the removal of material during the planarize 108 process and/or to ensure sufficient final region depth D per subset of replacement regions.

Continuing with FIG. 2E, the second replacement material 240 may comprise any material as previously described with reference to first replacement material 230. For example, second replacement material 240 may comprise Si, SiGe, and/or one or more III-V materials. In an example embodiment, substrate 200 comprises Si, first replacement material 230 comprises either SiGe or one or more III-V materials, and second replacement material 240 comprises the other of SiGe and one or more III-V materials (relative to what first replacement material 230 comprises). In such an example embodiment, first replacement material 230 may comprise SiGe and second replacement material 240 may comprise one or more III-V materials. In some embodiments, replacement region 240 may comprise the same material as replacement regions 230, and the different subset of regions may be formed to achieve, for example, regions comprising the same material but different depths, depending upon the end use or target application. Recall that processes 102-108 may be repeated 110 as many times as desired to form N subsets of replacement regions having.

Figure 2F:
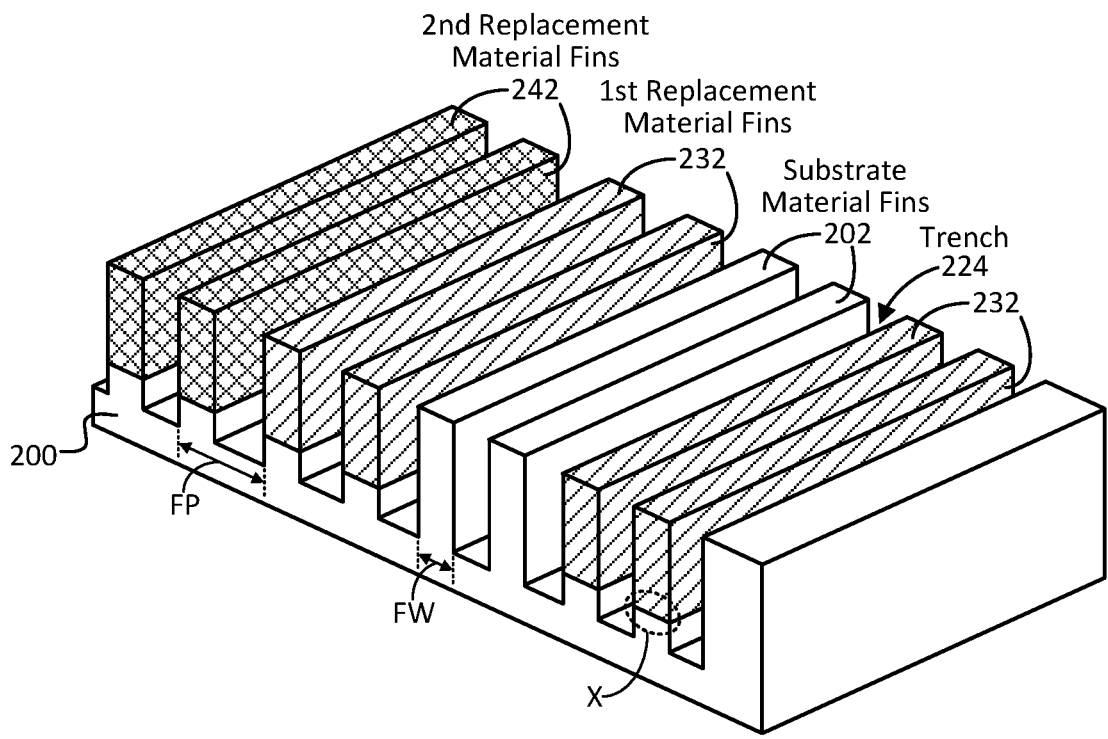

Method 100 of FIG. 1 continues with shallow trench recess 112 for isolation to pattern fins (202, 232, 242) in the structure of FIG. 2E, and thereby form the resulting example structure of FIG. 2F, in accordance with an embodiment. Shallow trench recess 112 may include any number of masking and etching processes, and/or any other suitable techniques, such as standard lithography or backbone or spacer methods. In an example instance, all of the fins (202, 232, 242) of the structure of FIG. 2F may have been patterned and formed using one isolation trench etching process, while in other instances, multiple isolation trench etching processes may have been used. Note that etch 104 may be used to etch one or more relatively wide trenches in the substrate (e.g., trenches 202 and 204 shown in FIG. 2B) to be later filled by replacement semiconductor material (e.g., during deposition 106), whereas shallow trench recess 112 is used to etch trenches (e.g., trench 224 shown in FIG. 2F) in the replacement material regions and, where present, native substrate material regions, to be later filled by insulating material for purposes of isolation of the fins formed in the resulting structure. Therefore, etch 112 can be performed to create isolation trenches for resulting fins formed in the replacement material regions and, where present, native substrate material regions, where the fins are essentially anti-trench. The resulting fin width FW and fin pitch FP for each fin may be achieved as desired based on the process(es) used when patterning the fins using the shallow trench recess process 112. In some embodiments, all of the resulting fins formed as a result of the isolation trench etch may have equal or similar fin widths FW and/or fin pitches FP, while in other embodiments the fins may have varied fin widths FW and/or fin pitches FP. Note that in some cases, the regions of different materials may have different etch bias and thus may require different as-drawn fin width to accomplish equal final patterned fin widths FW and/or fin pitches FP. Further note that the depths D and widths W used for the subsets of regions prior to patterning 112 may affect the fin widths FW, fin pitches FP, and fin heights of the resulting structure formed after patterning 112. In some embodiments, the fin widths FW and fin pitches FP may be formed in an arbitrary manner or formed to meet a desired end use or target application. Numerous variations on fin sizes, shapes, quantities, pitches, and configurations will be apparent in light of this disclosure.

In the specific example structure shown in FIG. 2F, two fins 202 were formed of the native substrate material, four fins 232 were formed of the first replacement material, and two fins 242 were formed of the second replacement material as a result of the shallow trench recess process. As can also be seen, the fins 232, 242 formed from the replacement material regions 230, 240 include a portion of native substrate material at the lower portions of the fins; however, the fins need not be formed in such a manner. In some embodiments, fins formed may comprise a single material (e.g., only Si, SiGe, or a III-V material) or they may comprise multiple materials, such as fins 232, 242 shown in FIG. 2F. In a specific example case, fins 202 may comprise Si (where substrate 200 comprises Si), first replacement material fins 232 may comprise SiGe, and second replacement material fins 242 may comprise one or more III-V materials. Note that although fins 202 of the native substrate material are shown in the example structure of FIG. 2F, the techniques described herein may be used to replace the entirety of the native substrate material, resulting in a structure with only replacement material fins. Further note that although three different fin types (202, 232, 242) are shown in the example structure of FIG. 2F, the techniques described herein may be used to provide any number of fin types. For instance, in another embodiment, FIG. 2F may be further understood to include four fin types: silicon fins 202, germanium fins 232 (two fins closest in the foreground), SiGe fins 232 (the other set of fins 232 shown), and III-V material fins 242. Any one of these fin types may be native to the substrate. Alternatively, all four fin types may be replacement fins. In any case, each of these fin types can then be used to form different transistor types.

As can be seen from FIG. 2F, multiple fins were formed from regions of the structure of FIG. 2E. For example the first replacement regions 230 and the second material replacement region 240 were patterned 112 into two fins each, as was the native substrate material region between the 230 regions, for a total of eight fins of concern in the structure of FIG. 2F. The fins 232, 242 formed from the replacement regions 230, 242 and on substrate 200 (whether or not substrate material is a part of the fins) have a substantially planar interface between the replacement material and the substrate material. For example, interface X (indicated by a dotted ellipse) in FIG. 2F shows the interface between replacement material 230 and substrate material in fin 232. A substantially or nearly planar interface (as opposed to a curved or faceted or otherwise non-flat interface) can be achieved using method 100, because the fins are formed from replacement regions having widths W greater than the fin widths FW formed from such regions. In other words, depositing replacement material into trenches having widths substantially or nearly the same as a narrow fin formed from the replacement material results in difficulty forming a flat interface at the bottom of the trench. In this example embodiment, because trench 222 was formed with a width W greater than the fin width FW of fin 232 (e.g., at least 2× greater, to name a specific case), the first replacement fill material was deposited on a substantially planar (or otherwise flat) surface. In addition, higher quality starting surfaces for the bottom of the trenches can be achieved when forming trenches during etch 104 (e.g., trenches 220 and 222) due to, for example, the surface in the trenches being easier to clear as a result of being wider than the width needed for one fin. Substantially or nearly planar as used herein may include exactly planar plus or minus 5, 10, 15, or 20 percent variation from exactly planar, for example. Numerous other benefits of the techniques and resulting structures described herein will be apparent in light of the present disclosure.

Figure 2G:
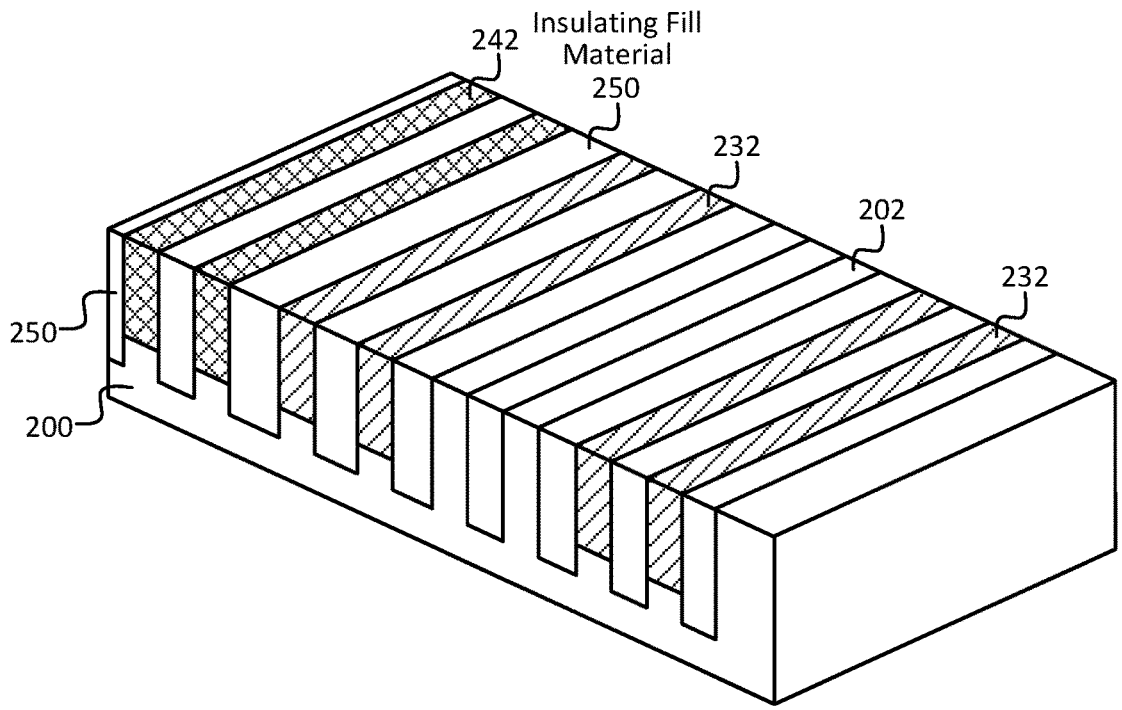

Method 100 of FIG. 1 continues with depositing 114 shallow trench isolation (STI) or otherwise insulating material 250 and then planarizing to form the resulting example structure of FIG. 2G, in accordance with an embodiment. Deposition 114 of STI material 250 may include any deposition process described herein (e.g., CVD, ALD, LPE, PVD, MBE), or any other suitable deposition process. STI material 250 may comprise any suitable insulating material, such as one or more dielectric or oxide materials (e.g., silicon dioxide).

In some embodiments, deposition of the STI material 250 may include an optional passivation 116 process to, for example, prevent issues caused by the deposition of the STI material 250 and/or increase the compatibility of the STI material 250 with the varying fin materials. Such a passivation process 116 may occur before, during, and/or after deposition process 114 (and therefore before or after the associated planarization process). In some cases, the passivation 116 process may be dependent upon the fin materials and the STI material. For example in the case where silicon dioxide is used as the STI material 250, yttrium oxide or aluminum nitride may be used as a passivating material when depositing the silicon dioxide STI material on SiGe or Ge fins. In another example case where silicon dioxide is used as the STI material 250, aluminum oxide, hafnium oxide, or sulfur may be used as a passivating material when depositing the silicon dioxide STI material on fins comprising one or more III-V materials. In some embodiment, the passivation may be native to the STI material 250, while in other embodiments, a passivating liner may be deposited/grown on the fin walls before depositing the STI material 250 in the trenches between fins (202, 232, 242). In embodiments where passivation 116 is performed after deposition of the STI material 250, such a process may include, for example a high-pressure hydrogen or deuterium anneal. Any suitable passivation techniques and materials may be used as will be apparent in light of the present disclosure.

Figure 2H:
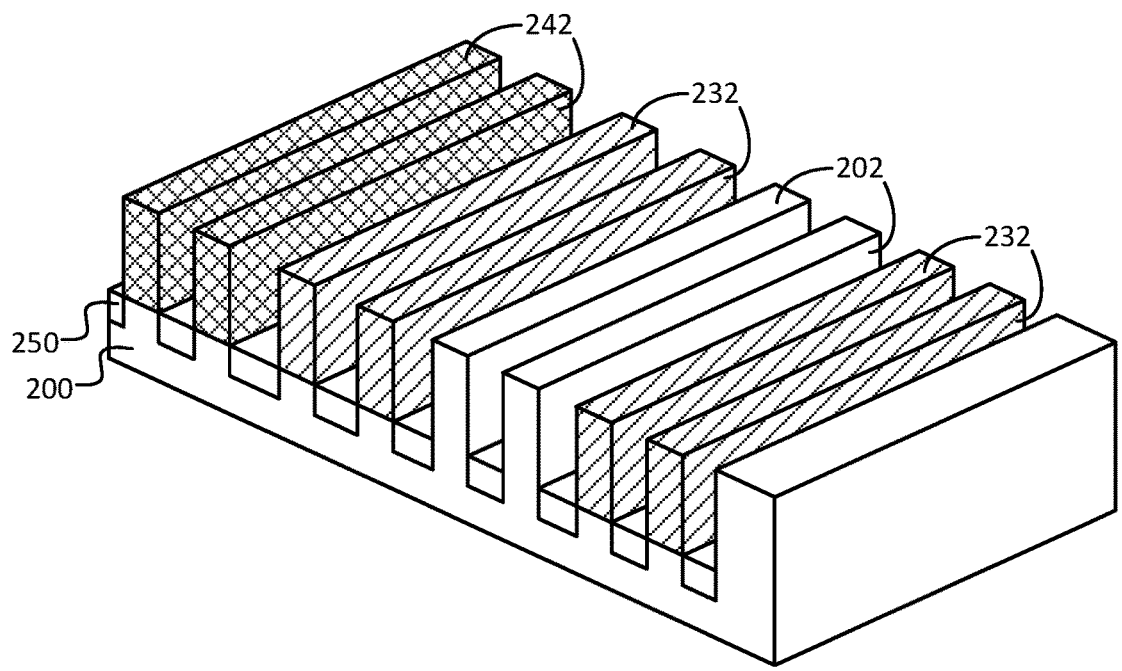

Method 100 of FIG. 1 optionally continues with recessing 118 the STI material 250 to form the example resulting structure of FIG. 2H, in accordance with an embodiment. In embodiments where the STI material 250 is not recessed, the resulting structure may be used for planar transistor configurations, for example. In this example embodiment, where the STI material 250 is recessed 118 to re-expose fins 202, 232, and 242, the resulting structure may be used for non-planar transistor configurations, as will be described in more detail herein. Recessing 118 the STI material 250 may include any suitable techniques, such as masking and etching processes, for example. As can be seen in the example structure of FIG. 2H, the STI material 250 was recessed 118 to a level equal with the base of the replacement materials of fins 232 and 242 (in other words, to a level equal to substantially planar interface X). In some such instances, passivation 116 may not be required due to no overlap between the STI material 250 and the replacement material of fins 232 and 242. However, in some instances, the STI material 250 may be recessed 118 to other levels, such as higher than the X interface level, for example. In some such instances, passivation 116 may be used to help with the overlapping between the STI material 250 and the replacement material of fins 232 and 242. In some embodiments, an additional passivation process may be performed after recess 118 has been completed, depending upon the end use or target application.

Figure 2I:
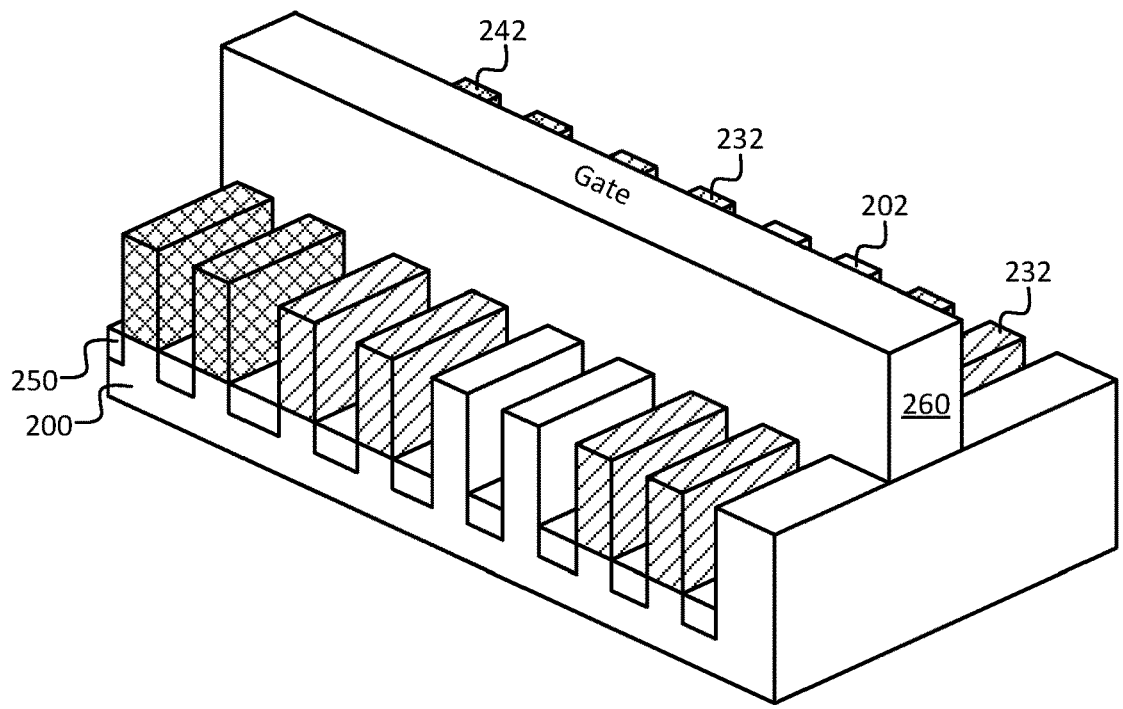
Figure 2J:
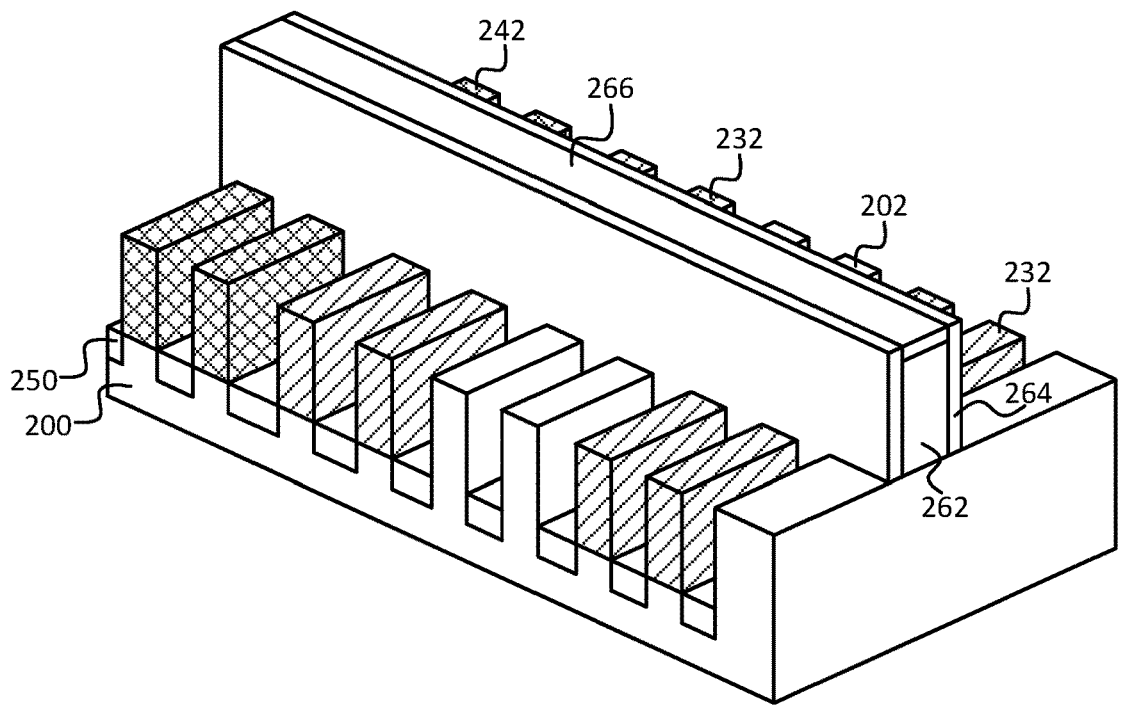
Figure 2K:
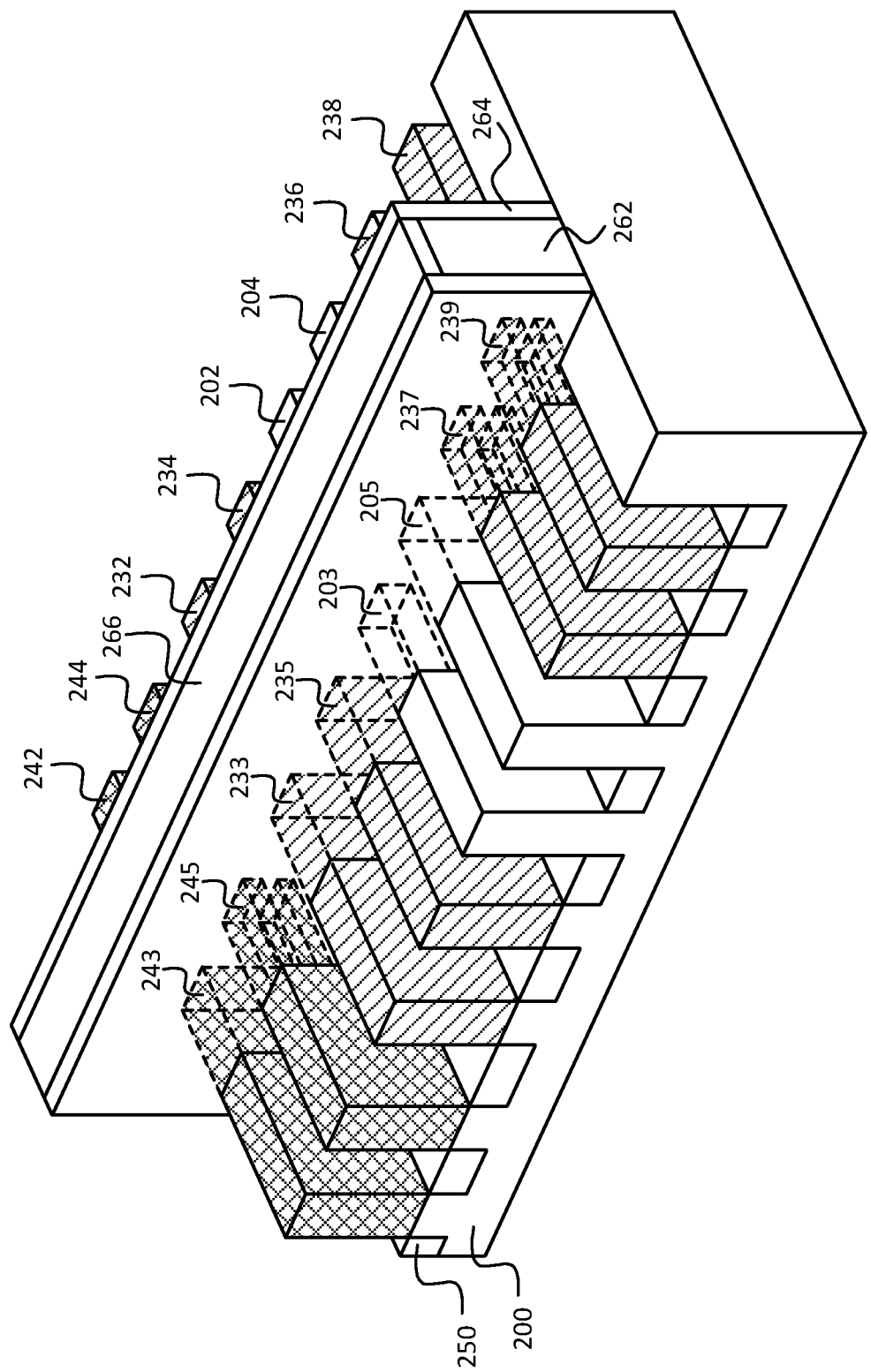

Method 100 of FIG. 1 optionally continues with completing 120 the formation of one or more transistors to form the example resulting structures of FIGS. 2I-K, in accordance with some embodiments. Various different processes can be performed to complete 120 the formation of one or more transistors, and such processes may include forming a gate stack 260 on fins 202, 232, and 242, as can be seen in FIG. 2I, in accordance with an embodiment. In some embodiments, the formation of gate stack 260 may include dummy gate oxide deposition, dummy gate electrode (e.g., poly-Si) deposition, and patterning hardmask deposition. Additional processing may include patterning the dummy gates and depositing/etching spacer material. Following such processes, the method may continue with insulator deposition, planarization, and then dummy gate electrode and gate oxide removal to expose the channel region of the transistors, such as is done for a replacement metal gate (RMG) process. Following opening the channel region, the dummy gate oxide and electrode may be replaced with, for example, a hi-k dielectric and a replacement metal gate, respectively. Other embodiments may include a standard gate stack formed by any suitable process. Any number of standard back-end processes may also be performed to help complete 120 the formation of one or more transistors. Method 100 may include various suitable additional or alternative processes, as will be apparent in light of this disclosure.

In the example structure shown in FIG. 2J, the gate stack 260 includes gate electrode 262 and a gate dielectric (not shown for ease of illustration) formed directly under gate electrode 262. The gate dielectric and gate electrode may be formed using any suitable technique and from any suitable materials. For example, the gate stack may have been formed during a replacement metal gate process, as previously described, and such a process may include any suitable deposition technique (e.g., CVD, PVD, etc.). The gate dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. Further, the gate electrode 262 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. As can also be seen, spacers 264 to provide sides of the gate stack 260, as normally done. A hardmask 266 can then be formed to protect the gate stack form subsequent processing. Once the gate stack is fabricated, the source/drain regions can be processed. The source/drain regions of fins 202, 232, and 242 are formed in the fin regions on either side of the gate stack, as normally done (e.g., ion implantation, or etch and deposition and in situ doping, or any other suitable source/drain forming process). Contacts may be formed on those source/drain regions using, for example, a silicidation process (generally, deposition of contact metal and subsequent annealing). Typical source drain region materials included, for example, silicon, germanium, SiGe, III-V compounds, to name a few example materials, which can be doped as needed to provide the desired polarity. Example source drain contact materials include, for example, tungsten, titanium, silver, gold, aluminum, and alloys thereof.

In the example structure shown in FIG. 2K, the channel region is shown under the gate stack and the individual fins were assigned numbers, for purposes of description. As can be seen, the eight fins shown include: native substrate material fins 202 and 204; first replacement material fins 232, 234, 236, and 238; and second replacement material fins 242 and 244. The corresponding channel region for each fin is identified by the next higher number relative to the fin identifier, such as fin 202 includes channel region 203, fin 204 includes channel region 205, fin 232 includes channel region 233, and so on. As can be seen based on the corresponding channel regions, some of the finned configurations were formed into nanowire (or nanoribbon) configurations. More specifically, fin 202 includes one nanowire in channel region 203, and fins 236, 238, and 244 include two nanowires in respective channel regions 237, 239, and 245. Such nanowire/nanoribbon channel regions may be formed using any suitable techniques, such as during a replacement gate process as is sometimes done. The particular non-planar channel configurations (e.g., fin or nanowire or nanoribbon) may be selected based on factors such as the end use or target application or desired performance criteria. Note that although the structures are shown having non-planar architecture, method 100 of FIG. 1 can be used to form planar configurations (e.g., where recess 118 is not performed).

As will be apparent in light of the present disclosure, the appropriate doping may be performed in the channel and/or source/drain regions depending upon the materials in those regions and the desired end use or target application. For example, channels regions comprising Si and/or III-V materials may be p-type doped (e.g., to form an n-MOS transistor) and channel regions comprising Ge and/or SiGe materials may be n-type doped (e.g., to form a p-MOS transistor). Doping, as variously described herein, may be performed using any suitable techniques and dopants, depending, for example, upon the material being doped, the desired n-type or p-type doping result, and/or the target application. For instance, p-type dopants may include boron (B), aluminum (Al), gallium (Ga), and/or indium (In), just to name a few examples. In addition, n-type dopants may include carbon (C), silicon (Si), germanium (Ge), tin (Sn), selenium (Se), and/or tellurium (Te), just to name a few examples. Numerous different doping schemes will be apparent in light of the present disclosure.

FIG. 3 illustrates an integrated circuit formed using method 100 of FIG. 1, in accordance with an embodiment of the present disclosure. The structure in FIG. 3 is similar to the structure in FIG. 2K, except that all channel regions (listed in the 300s) have a finned configuration and channel regions 303 and 305 comprise different material than that of 203 and 205 of FIG. 2K. The material of the channel regions 303 and 305 of the example structure in FIG. 3 is shown as having been replaced to match the second replacement material. Such a replacement may have been performed during a replacement gate process, for example. In one example case, the substrate 200 (and thus source/drain regions of fins 202 and 204) may comprise Si, the first replacement material may comprise Ge and/or SiGe (e.g., fins 232, 234, 236, and 238 and corresponding channel regions 333, 335, 337, and 339), and the second replacement material may comprise one or more III-V materials (e.g., fins 242 and 244 including respective channel regions 343 and 345, as well as channel regions 303 and 305). In such an example case, the Ge/SiGe channel regions 333, 335, 337, 339 may be n-type doped for p-MOS transistors and the III-V material channel regions 343, 345, 303, and 305 may be p-type doped for n-MOS. Further, in such an example case, one or more p-MOS transistors may be used with one or more n-MOS transistors to form one or more CMOS transistors, depending on the end use or target application. Note that the structure of FIG. 2K maintained native substrate material channel regions (203 and 205) whereas the structure of FIG. 3 replaced all channel regions with replacement material and thus no native substrate material channel regions were maintained.

Figure 4:
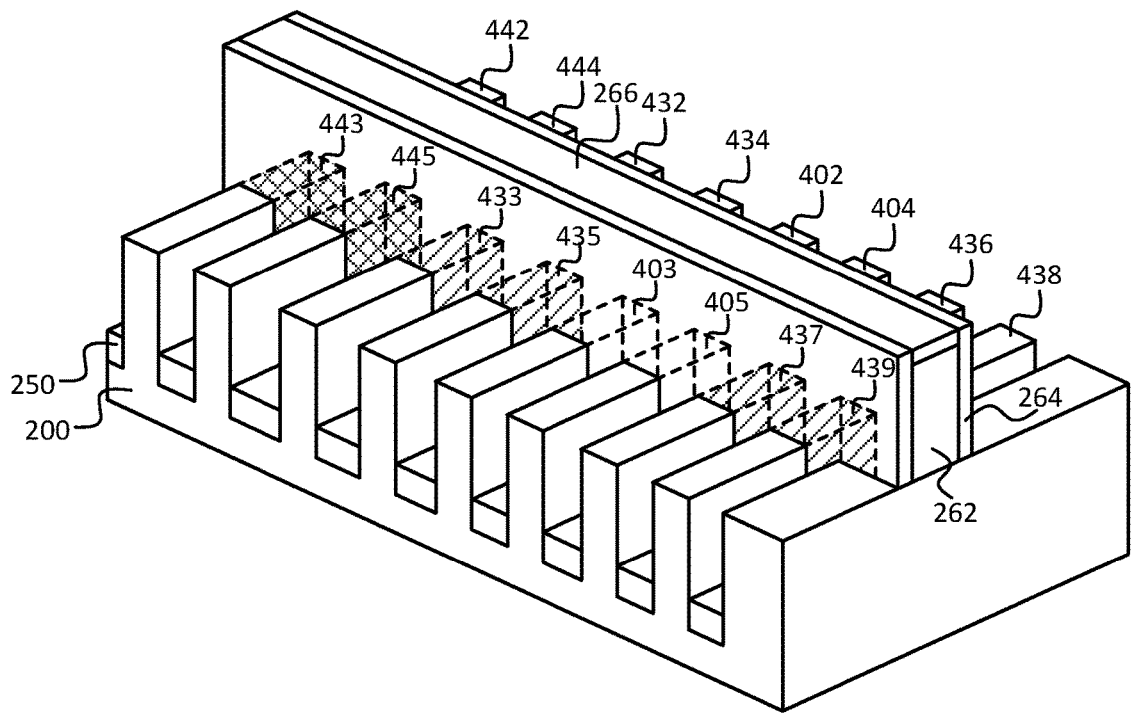
FIG. 4 illustrates an integrated circuit formed using the method of FIG. 1 during a replacement gate process, in accordance with an embodiment of the present disclosure.

FIG. 4 illustrates an integrated circuit formed using method 100 of FIG. 1 during a replacement gate process, in accordance with an embodiment of the present disclosure. The structure in FIG. 4 is similar to the structure in FIG. 2K, except that all channel regions (listed in the 400s) have a finned configuration and only the channel regions of the fins comprise the replacement material, as can be seen. The channel regions 403, 405, 433, 435, 437, 439, 443, and 445 of the structure of FIG. 4 respectively comprise the same material as the channel regions 203, 205, 233, 235, 237, 239, 243, and 245 of the structure of FIG. 2K. However, the source/drain regions differ, with all of the source/drain regions of fins 402, 404, 432, 434, 436, 438, 442, and 444 of FIG. 4 comprising the same material due to the replacement method 100 of FIG. 1 being performed only in the channel region during a replacement gate process (e.g., a replacement metal gate (RMG) process). In other words, in such an example embodiment, FIGS. 2A-H may illustrate only the channel region inside of an opened up gate structure and thus the replacement techniques variously described herein may only be performed in the channel region. Note that the structure of FIG. 4 may have also been achieved by replacing the source/drain regions. In such an example case, the source/drain regions of the fins may include an interface showing the separation of the substrate material from the replacement source/drain region material.

Example System

Figure 5:
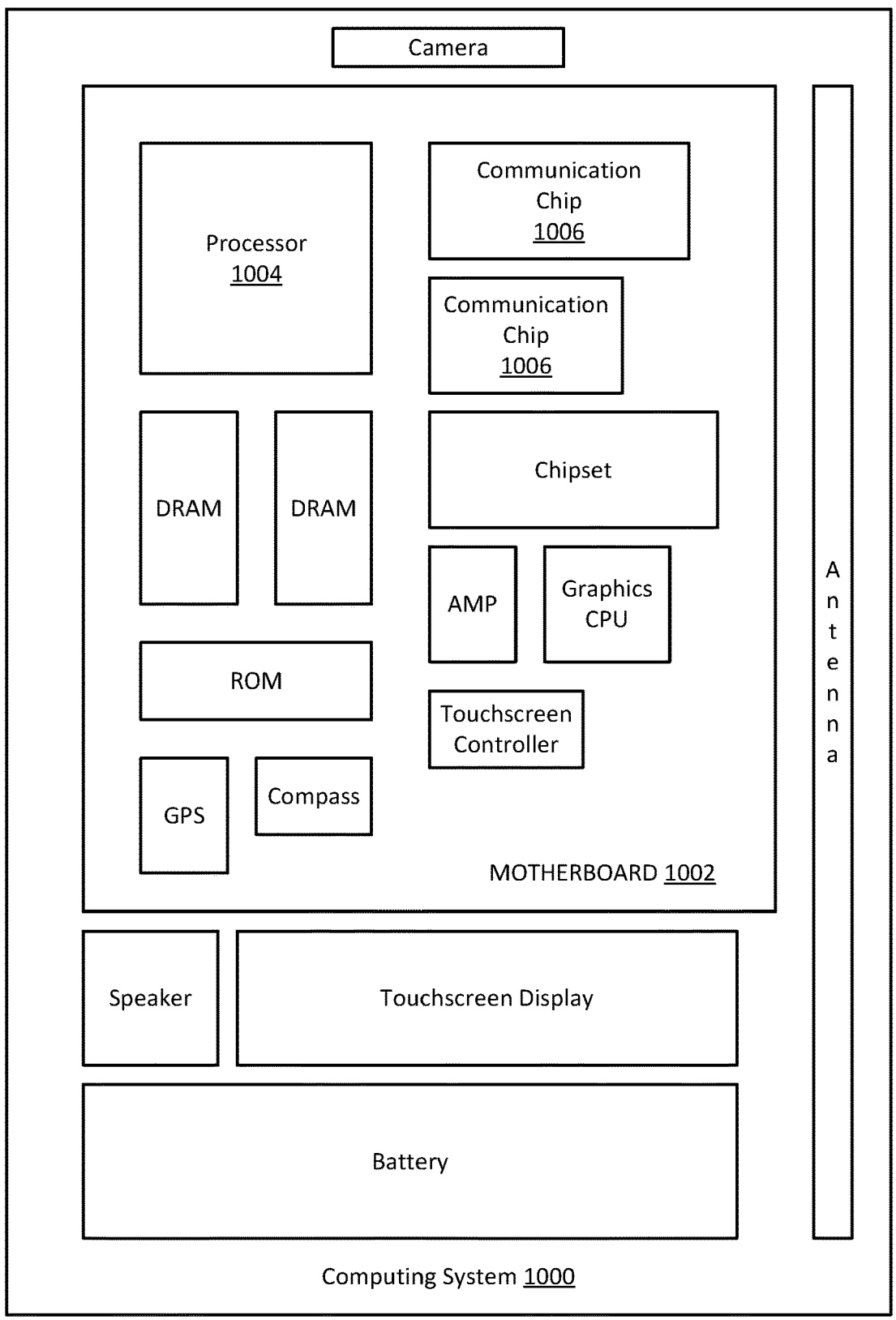
FIG. 5 illustrates a computing system implemented with integrated circuit structures or devices formed using the techniques disclosed herein, in accordance with an embodiment of the present disclosure.

FIG. 5 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a substrate; a first transistor including a channel region, the first transistor channel region formed on or from a portion of the substrate and comprising a first material; and a second transistor including a channel region, the second transistor channel region formed on the substrate and comprising a second material; wherein the interface between the second material and the substrate is substantially planar in that it is non-faceted and substantially free of amorphization and crystalline damage. In a more general sense, the interface between the second material and the substrate is flatter than the interface would be if that interface was formed via a single fin replacement process where a place holder fin is etched out and replaced with the second material. As will be appreciated in light of this disclosure, the interface resulting from such single fin replacement processes (i.e., trench bottom) will be curved or faceted or irregular (damaged) or otherwise non-flat. In addition, device quality can be based on, for example, a defect count obtained by summing up dislocations and stacking faults at the interface and in the epitaxial layer, with defect counts greater than 10000 per linear centimeter (cm) of fin length being unacceptable for device grade applications, in accordance with an embodiment of the present disclosure. Typical defect count densities of standard dry or wet etches in this context are above 10000 per linear cm of fin length. In contrast, dislocation and stacking fault counts below 1000 per linear cm, or below 500 per linear cm, or below 100 per linear cm, or below 50 per linear cm, and as low as zero defects per linear cm, may result at the interface when using etch techniques provided herein, in accordance with some embodiments. To this end, "substantially free of amorphization and crystalline damage" as used herein can be quantified in terms such as defect count per linear cm of fin length (or other area of interest), such that the combined count of dislocation and stacking faults at the interface between the replacement material and the underlying substrate is below 10000 per linear cm, and in some embodiments below 5000 per linear cm, or below 1000 per linear cm, or below 500 per linear cm, or below 100 per linear cm, or below 50 per linear cm, and as low as zero defects per linear cm. As will be appreciated, such a defect count can readily be extrapolated to areas smaller than a linear centimeter. For instance, in some embodiments, the defect count at a 10 nanometer (nm) length is below interface 0.001 defects per linear nm (extrapolated from 10000 defects per linear centimeter), or below 0.0001 defects per linear nm (extrapolated from 1000 defects per linear centimeter), or below 0.00001 defects per linear nm (extrapolated from 100 defects per linear centimeter), or below 0.000001 defects per linear nm (extrapolated from 10 defects per linear centimeter), and so on, down to zero defects per linear nm. In a more general sense, an interface between the replacement material and the underlying substrate configured in accordance with an embodiment of the present disclosure has less than 10K defects/linear cm, or less than 1K defects/linear cm, or less than 500 defects/linear cm, or less than 100 defects/linear cm, or less than 50 defects/linear cm. Thus, in one specific example case, the interface between a silicon substrate and a SiGe replacement fin has less than 10K defects/linear cm, or less than 1K defects/ linear cm, or less than 500 defects/linear cm, or less than 100 defects/linear cm, or less than 50 defects/linear cm.

Example 2 includes the subject matter of Example 1, wherein both the substrate and the first material comprise silicon (Si).

Example 3 includes the subject matter of any of Examples 1-2, wherein the second material comprises one of silicon germanium (SiGe) and a III-V material.

Example 4 includes the subject matter of any of Examples 1-3, wherein the first transistor channel region is formed from a portion of the substrate.

Example 5 includes the subject matter of Example 1, wherein the first material comprises one of silicon germanium (SiGe) and a III-V material formed on the substrate and the second material comprises the other of SiGe and a III-V material.

Example 6 includes the subject matter of any of Examples 1-5, further including a third transistor including a channel region, the third transistor channel region formed on the substrate and comprising a third material different from the first and second materials.

Example 7 includes the subject matter of Example 6, wherein the substrate is bulk silicon (Si), the first material is native to the substrate, the second material comprises one of silicon germanium (SiGe) and a III-V material, and the third material comprises the other of SiGe and a III-V material.

Example 8 includes the subject matter of any of Examples 1-7, wherein the second transistor includes source/drain regions formed in the second material.

Example 9 includes the subject matter of any of Examples 1-8, wherein at least one of the first and second transistors include source and drain regions comprising material different than the channel region material.

Example 10 includes the subject matter of any of Examples 1-9, wherein each of the first and second transistors are fin-based field effect transistors (FinFETs) each having three gates.

Example 11 includes the subject matter of any of Examples 1-9, wherein at least one of the first and second transistors has a nanowire or nanoribbon configuration.

Example 12 includes the subject matter of any of Examples 1-9, wherein at least one of the first and second transistors has a planar configuration.

Example 13 is a complementary metal-oxide-semiconductor (CMOS) device including the integrated circuit of any of Examples 1-12.

Example 14 is a computing system including the integrated circuit of any of Examples 1-12.

Example 15 is an integrated circuit including: a bulk silicon substrate; a first fin extending from and native to the substrate; and a second fin extending from the substrate and comprising one of silicon germanium (SiGe) and a III-V material, wherein the interface between the second fin and the substrate is substantially planar in that it is non-faceted and substantially free of amorphization and crystalline damage. In some such embodiments, the interface is substantially free of amorphization and crystalline damage in that it has less than 10000 defects/linear cm, or less than 1000 defects/linear cm, or less than 500 defects/linear cm, or less than 100 defects/linear cm, or less than 50 defects/linear cm, or in some cases, is defect-free. In a more general sense, the interface is flatter than the interface would be if that interface was formed via a single fin replacement process where a place holder fin is etched out and replaced with the second material.

Example 16 includes the subject matter of Example 15, further including: a first transistor formed on the first fin; and a second transistor formed on the second fin.

Example 17 includes the subject matter of Example 15, further including: a first transistor including a channel region formed from the first fin; and a second transistor including a channel region formed from the second fin.

Example 18 includes the subject matter of any of Examples 16-17, wherein the first transistor is a p-MOS transistor and the second transistor is an n-MOS transistor.

Example 19 includes the subject matter of any of Examples 16-18, wherein at least a portion of one of the first and second fins is formed into one or more nanowires or nanoribbons.

Example 20 includes the subject matter of any of Examples 15-19, wherein a portion of the first fin is replaced by one or more III-V materials.

Example 21 includes the subject matter of any of Examples 15-20, further including a third fin extending from the substrate and comprising the other of silicon germanium (SiGe) and a III-V material, wherein the interface between the third fin and the substrate is substantially planar in that it is non-faceted and substantially free of amorphization and crystalline damage.

Example 22 is a complementary metal-oxide-semiconductor (CMOS) device including the integrated circuit of any of Examples 15-21.

Example 23 is a computing system including the integrated circuit of any of Examples 15-21.

Example 24 is a method of forming an integrated circuit, the method including: replacing a region of a substrate with a first replacement material, the substrate comprising a substrate material different from the first replacement material; patterning a first set of fins from the first replacement material region, the first set comprising a plurality of fins; patterning a second set of fins from a second region above the substrate; and forming at least two transistors using the fins formed in the first and second regions.

Example 25 includes the subject matter of Example 24, wherein patterning the first and second set of fins is performed simultaneously.

Example 26 includes the subject matter of any of Examples 24-25, wherein the second region above the substrate is formed from the substrate.

Example 27 includes the subject matter of any of Examples 24-25, wherein the second region above the substrate is a second replacement region comprising a second replacement material different from the substrate material and the first replacement material. As will be appreciated in light of this disclosure, the first and second replacement materials can be deposited into corresponding trenches formed in the substrate so as to have a certain thickness or depth. As previously explained, while the trenches (and replacement layers) may have the same depth, they do not necessarily have to have the same depth. For instance, to achieve a desired defect density in the active device (near the top), the method may include growing a thicker replacement layer for some materials that are easier to grow in a defect-free or low-defect state. Generally the most defective region will be the bottom interface and as the film grows, the defect levels reduce. For example, for SiGe replacement material the defect density may be lower than 100/cm at the interface and reduce further in the active device region higher up in the SiGe replacement material layer, but for III-V replacement material the defect density may be relatively higher at the interface (e.g., near the 10

K/cm mark, but less than 10 K/cm) and 1 K/cm in the active device region higher up in that III-V replacement material layer.

Example 28 includes the subject matter of any of Examples 24-27, wherein at least a portion of the fins formed in the first and second regions are used as channel regions for transistors formed thereon.

Example 29 includes the subject matter of any of Examples 24-28, wherein the region of the substrate replaced is at least four times the width of a single fin included in the first set of fins.

Example 30 includes the subject matter of any of Examples 24-29, wherein the replacing and patterning processes are performed only in a channel region of the at least two transistors during a replacement gate process.

Example 31 includes the subject matter of any of Examples 24-30, wherein the substrate comprises silicon.

Example 32 includes the subject matter of any of Examples 24-31, wherein the first replacement material comprises one of silicon germanium (SiGe) and a III-V material.

Example 33 includes the subject matter of any of Examples 24-32, further including depositing isolation material around the fins prior to forming the at least two transistors.

Example 34 includes the subject matter of Example 33, further including performing a passivation process at least one of prior to, during, and after the deposition process.

Example 35 includes the subject matter of any of Examples 24-34, further including: replacing a second region of the substrate with a second replacement material; and patterning a third set of fins from the second replacement material region.

Example 36 includes the subject matter of Example 35, wherein patterning the first, second, and third set of fins is performed simultaneously.

Example 37 includes an integrated circuit that includes: a substrate; a first transistor including a channel region, the first transistor channel region formed on or from a portion of the substrate and comprising a first material; a second transistor including a channel region, the second transistor channel region formed on the substrate and comprising a second material; a third transistor including a channel region, the third transistor channel region formed on the substrate and comprising a third material different from the first and second materials; and a fourth transistor including a channel region, the fourth transistor channel region formed on the substrate and comprising a fourth material different from the first, second, and third materials; wherein the interface between the substrate and each of at least the second, third, and fourth materials is substantially planar in that it is non-faceted and substantially free of amorphization and crystalline damage. In some such embodiments, the interface has less than 10K defects/linear cm, or less than 1K defects/linear cm, or less than 500 defects/linear cm, or less than 100 defects/linear cm, or less than 50 defects/linear cm, or in some cases, is defect-free. In a more general sense, the interface is flatter than the interface would be if that interface was formed via a single fin replacement process where a place holder fin is etched out and replaced with the second material.

Example 38 includes the subject matter of Example 37, wherein the first, second, third, and fourth materials are different from one another in that they are different semiconductor materials that may or may not have the same doping. For instance, they may be different elements (e.g., silicon and germanium or compounds (e.g., SiGe and/or III-V material compounds).

Example 39 includes the subject matter of Example 37 or 38, wherein the first, second, third, and fourth materials are each selected from the group of: silicon, germanium, silicon germanium (SiGe), and a III-V material.

Example 40 includes the subject matter of any of Examples 37 through 39, wherein the first transistor channel region is formed from a portion of the substrate. Thus, for example, the first transistor channel region can be a silicon channel region formed from a portion of a bulk silicon substrate, or the first transistor channel region can be a germanium channel region formed from a portion of a bulk germanium substrate, or the first transistor channel region can be a SiGe channel region formed from a portion of a bulk SiGe substrate, or the first transistor channel region can be a III-V channel region formed from a portion of a bulk III-V substrate.

Example 41 includes the subject matter of any of Examples 37 through 39, wherein the first transistor channel region is formed on the substrate. In such a case, note that the interface between the substrate and the first material may also be substantially planar in that it is non-faceted and substantially free of amorphization and crystalline damage.

Example 42 includes the subject matter of any of Examples 37 through 41, wherein the first material is silicon, the second material is germanium, the third material is silicon germanium (SiGe), and the fourth material comprises a III-V material. Any one of these may be native to the substrate, or all may be replacement materials.

Example 43 includes the subject matter of any of Examples 37 through 42, wherein the substrate is bulk silicon and the first material comprises silicon of the substrate.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a substrate comprising a substrate semiconductor material;
   a first transistor including a first channel material, the first channel material being on the substrate and comprising a first semiconductor material different from and in contact with the substrate semiconductor material; and
   a second transistor including a second channel material, the second channel material being on the substrate and comprising a second semiconductor material different from the first semiconductor material and different from and in contact with the substrate semiconductor material; and
   a third transistor including a third channel material, the third channel material being on the substrate and comprising a third semiconductor material different from the first and second semiconductor materials and different from and in contact with the substrate semiconductor material, wherein the substrate is bulk silicon (Si), the second semiconductor material comprises one of silicon germanium (SiGe) or a III-V material, and the third semiconductor material comprises the other of SiGe or the III-V material;

wherein an interface between the second semiconductor material and the substrate semiconductor material is substantially planar in that the interface is non-faceted and substantially free of amorphization and crystalline damage.

2. The integrated circuit of claim 1, wherein the first semiconductor material comprise silicon (Si).

3. The integrated circuit of claim 1, wherein the second transistor includes a source region and a drain region, the source region and drain region being in contact with the second semiconductor material.

4. The integrated circuit of claim 1, wherein
each of the first and second transistors includes a source region and a drain region,
the source and drain regions of the first transistor comprise semiconductor material different from the first semiconductor material, and
the source and drain regions of the second transistor comprise semiconductor material different from the second semiconductor material.

5. The integrated circuit of claim 1, wherein at least one of the first and second transistors is a fin-based field-effect transistor (FinFET).

6. The integrated circuit of claim 1, wherein at least one of the first and second transistors has a nanowire or nanoribbon configuration.

7. A complementary metal-oxide-semiconductor (CMOS) device comprising the integrated circuit of claim 1.

8. A computing system comprising the integrated circuit of claim 1.

9. An integrated circuit comprising:
a bulk silicon substrate;
a first fin extending from and in contact with the bulk silicon of the substrate;
a second fin adjacent the second fin, the second fin extending from and in contact with the bulk silicon of the substrate, wherein the first fin and the second fin comprise one of germanium or a III-V semiconductor material;
a third fin extending from and in contact with the bulk silicon of the substrate; and
a fourth fin adjacent the third fin, wherein the third fin and the fourth fin comprise the other of germanium or the III-V semiconductor material,
wherein a first interface between the first fin and the substrate is coplanar with a second interface between the second fin and the substrate, wherein the first interface and the second interface are non-faceted and substantially free of amorphization and crystalline damage in that the first interface and the second interface have fewer than 10,000 defects/linear cm, and
wherein a third interface between the third fin and the substrate is coplanar with a fourth interface between the fourth fin and the substrate, wherein the third interface and the fourth interface are non-faceted and substantially free of amorphization and crystalline damage in that the third interface and the fourth interface have fewer than 10,000 defects/linear cm.

10. The integrated circuit of claim 9, further comprising:
a first gate structure on the first fin, the first gate structure having a first source region and a first drain region to either side of the first gate structure; and
a second gate structure on the second fin, the second gate structure having a second source region and a second drain region to either side of the second gate structure;
a third gate structure on the third fin, the third gate structure having a third source region and a third drain region to either side of the third gate structure; and
a fourth gate structure on the fourth fin, the fourth gate structure having a fourth source region and a fourth drain region to either side of the fourth gate structure.

11. The integrated circuit of claim 9, further comprising:
a first transistor including a channel region that is part of the first fin;
a second transistor including a channel region that is part of the second fin
a third transistor including a channel region that is part of the third fin; and
a fourth transistor including a channel region that is part of the fourth fin.

12. The integrated circuit of claim 11, wherein at least one of the first transistor and the second transistor is a p-type metal-oxide semiconductor (p-MOS) transistor and at least one of the third transistor and the fourth transistor is an n-type metal-oxide semiconductor (n-MOS) transistor.

13. An integrated circuit comprising:
a substrate comprising a first semiconductor material;
a first transistor including a first channel region, the first channel region being part of the substrate;
a second transistor including a channel region, the second transistor channel region being on the substrate and comprising a second semiconductor material different from and in contact with the first semiconductor material of the substrate;
a third transistor including a third channel region, the third transistor channel region being on the substrate and comprising a third semiconductor material different from the first and second semiconductor materials and in contact with the first semiconductor material of the substrate; and
a fourth transistor including a fourth channel region, the fourth transistor channel region being on the substrate and comprising a fourth semiconductor material different from the first, second, and third semiconductor materials and in contact with the first semiconductor material of the substrate,
where an interface between the first semiconductor material of the substrate and each of the second, third, and fourth semiconductor materials is substantially planar in that the interface is non-faceted and substantially free of amorphization and crystalline damage,
wherein the first, second, third, and fourth semiconductor materials are different from one another in that they are different semiconductor materials that may or may not have the same doping, and
wherein the first, second, third, and fourth semiconductor materials are each selected from silicon, germanium, silicon germanium (SiGe), and a III-V material.

14. The integrated circuit of claim 13, wherein the first semiconductor material is silicon, the second semiconductor material is germanium, the third semiconductor material is silicon germanium (SiGe), and the fourth semiconductor material comprises a III-V material.

15. The integrated circuit of claim 13, wherein the substrate is bulk silicon and the first semiconductor material comprises silicon of the substrate.

16. The integrated circuit of claim 1, wherein substantially planar is within 10% of exactly planar.

17. The integrated circuit of claim 1, wherein the first transistor comprises a fin comprising the first semiconductor material, or the second transistor comprises a fin comprising the second semiconductor material, or both the first transistor comprises a fin comprising the first semiconductor material and the second transistor comprises a fin comprising the second semiconductor material.

18. The integrated circuit of claim 13, wherein substantially planar is within 10% of exactly planar.

19. The integrated circuit of claim 13, wherein each of the second, third, and fourth transistor channel regions comprises a fin, the corresponding fins comprising the second, third, and fourth semiconductor materials, respectively.

* * * * *